United States Patent
Omura et al.

(10) Patent No.: US 11,959,980 B2
(45) Date of Patent: Apr. 16, 2024

(54) WEARABLE DEVICE, ELECTRONIC WATCH, MAGNETIC SENSOR CALIBRATION METHOD, AND RECORDING MEDIUM

(71) Applicant: CASIO COMPUTER CO., LTD., Tokyo (JP)

(72) Inventors: Tatsuyoshi Omura, Hamura (JP); Susumu Yamazaki, Kokubunji (JP); Mitsuaki Matsuo, Fussa (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 984 days.

(21) Appl. No.: 16/820,832

(22) Filed: Mar. 17, 2020

(65) Prior Publication Data
US 2020/0300929 A1    Sep. 24, 2020

(30) Foreign Application Priority Data
Mar. 20, 2019    (JP) ................. 2019-052244

(51) Int. Cl.
*G01R 33/00* (2006.01)
*G04G 5/00* (2013.01)
(Continued)

(52) U.S. Cl.
CPC .......... *G01R 33/0017* (2013.01); *G04G 5/00* (2013.01); *G04G 21/02* (2013.01); *G04G 99/006* (2013.01); *G06F 1/163* (2013.01)

(58) Field of Classification Search
CPC .............. G01R 33/0017; G01R 33/02; G01R 33/0035; G04G 5/00; G04G 21/02;
(Continued)

(56) References Cited

U.S. PATENT DOCUMENTS

2011/0003665 A1 *   1/2011   Burton ................. G04G 17/04
                                                                482/8
2013/0063647 A1 *   3/2013   Nishikawa ............ H04N 23/00
                                                                702/145
(Continued)

FOREIGN PATENT DOCUMENTS

CN          106574847 A         4/2017
CN          107796382 A         3/2018
(Continued)

OTHER PUBLICATIONS

Notice of Reasons for Refusal dated Jun. 6, 2023 received in Japanese Patent Application No. JP 2022-074043.
(Continued)

*Primary Examiner* — Christopher P McAndrew
(74) *Attorney, Agent, or Firm* — Scully, Scott, Murphy & Presser, P.C.

(57) ABSTRACT

Power consumption due to failed automatic calibration is suppressed. An electronic watch is provided with a magnetic sensor, a processor for performing calibration of the magnetic sensor and controlling two or more function modes, and an acceleration sensor for sensing movement of a user. The processor determines whether a state of movement sensed by the acceleration sensor is a calibratable state in which calibration of the magnetic sensor can be performed, performs discrimination of a function mode being executed among the two or more function modes, and performs the calibration of the magnetic sensor when (i) the state of movement sensed by the acceleration sensor is the calibratable state and (ii) the function mode is not a non-default mode, the non-default mode being a function mode executed in accordance with an operation by the user.

12 Claims, 7 Drawing Sheets

(51) Int. Cl.
*G04G 21/02* (2010.01)
*G04G 99/00* (2010.01)
*G06F 1/16* (2006.01)

(58) Field of Classification Search
CPC ...... G04G 99/006; G04G 19/12; G06F 1/163; G01C 17/38; G01D 21/02; G04B 47/06
USPC .......................................................... 324/202
See application file for complete search history.

(56) References Cited

U.S. PATENT DOCUMENTS

| | | | |
|---|---|---|---|
| 2014/0195185 A1* | 7/2014 | Anderson | G01P 3/44 |
| | | | 702/96 |
| 2014/0202229 A1* | 7/2014 | Stanley | G01C 25/005 |
| | | | 73/1.79 |
| 2014/0266160 A1* | 9/2014 | Coza | A63B 47/008 |
| | | | 324/207.11 |
| 2014/0278183 A1 | 9/2014 | Zheng et al. | |
| 2015/0149104 A1* | 5/2015 | Baker | G01R 33/0035 |
| | | | 702/87 |
| 2015/0227245 A1* | 8/2015 | Inagaki | G06F 3/0412 |
| | | | 345/173 |
| 2015/0233714 A1* | 8/2015 | Kim | G01C 21/1654 |
| | | | 33/356 |
| 2016/0081625 A1 | 3/2016 | Kim et al. | |
| 2016/0341569 A1* | 11/2016 | Won | G01R 33/0035 |
| 2017/0176187 A1* | 6/2017 | Ishihama | G01C 17/38 |
| 2017/0343349 A1* | 11/2017 | Han | G01C 19/56 |
| 2018/0067173 A1 | 3/2018 | Sekitsuka et al. | |
| 2022/0006892 A1* | 1/2022 | Perkins | H04R 1/028 |

FOREIGN PATENT DOCUMENTS

| | | |
|---|---|---|
| DE | 10 2013 226 677 A1 | 7/2014 |
| JP | 2005-249619 A | 9/2005 |
| JP | 2005-345389 A | 12/2005 |
| JP | 2005345140 A | 12/2005 |
| JP | 2006-030171 A | 2/2006 |
| JP | 2010-175553 A | 8/2010 |
| JP | 2010-210638 A | 9/2010 |
| JP | 2014-190757 A | 10/2014 |
| JP | 2016-031273 A | 3/2016 |
| JP | 2016-057183 A | 4/2016 |
| JP | 2016-061762 A | 4/2016 |
| JP | 2018-040652 A | 3/2018 |
| JP | 2018-169167 A | 11/2018 |

OTHER PUBLICATIONS

Notice of Reasons for Refusal dated Jun. 8, 2021 received in Japanese Patent Application No. JP 2019-052244 together with an English language translation.
Notice of Reasons for Refusal dated Nov. 2, 2021 received in Japanese Patent Application No. 20109-052244 together with an English language translation.
Extended European Search Report dated Jul. 23, 2020 received in European Patent Application No. EP 20162955.7.
First Office Action dated Jul. 12, 2022 received in Chinese Patent Application No. CN 202010203079.3.
Notice of Reasons for Refusal dated Sep. 12, 2023 received in Japanese Patent Application No. JP 2022-074043.
Notice of Reasons for Refusal dated Nov. 2, 2021 received in Japanese Patent Application No. 2019-052244 together with an English language translation.

* cited by examiner

WEARABLE DEVICE, ELECTRONIC WATCH, MAGNETIC SENSOR CALIBRATION METHOD, AND RECORDING MEDIUM

CROSS-REFERENCE TO RELATED APPLICATION

This application claims the benefit of Japanese Patent Application No. 2019-052244, filed on Mar. 20, 2019, the entire disclosure of which is incorporated by reference herein.

FIELD

The technical field of the present disclosure relates to a wearable device, an electronic watch, a magnetic sensor calibration method, and a recording medium.

BACKGROUND

Technology is described, for example, in Unexamined Japanese Patent Application Kokai Publication No. 2005-345389, that enables automatic magnetic sensor calibration by using rotation of a portable terminal device according to a vibrator operation, the magnetic sensor calibration being triggered by the vibrator operation at the time of an incoming call.

SUMMARY

A wearable device, an electronic watch, a magnetic sensor calibration method, and a recording medium are disclosed in embodiments of the present disclosure.

A wearable device that is an aspect of the present disclosure includes:

a magnetic sensor; and a processor configured to perform a magnetic sensor calibration of the magnetic sensor and control two or more function modes including a first function mode and a second function mode, wherein the processor determines whether a calibratable state exists in which the magnetic sensor is calibratable, performs discrimination as to which function mode of the two or more function modes is being executed, performs the magnetic sensor calibration when (i) the function mode being executed is the first function mode and (ii) the calibratable state exists, and does not perform the magnetic sensor calibration when (i) the function mode being executed is the second function mode or (ii) the calibratable state does not exist.

BRIEF DESCRIPTION OF THE DRAWINGS

A more complete understanding of this application can be obtained when the following detailed description is considered in conjunction with the following drawings, in which.

DETAILED DESCRIPTION

Embodiments are described below with reference to drawings. Components within the drawings that are the same or equivalent are assigned the same reference sign.

Embodiment 1

A wearable device according to Embodiment 1 is a wristwatch-type electronic watch provided with a magnetic sensor and is worn on an arm of the user via a watchband.

Figure 1:
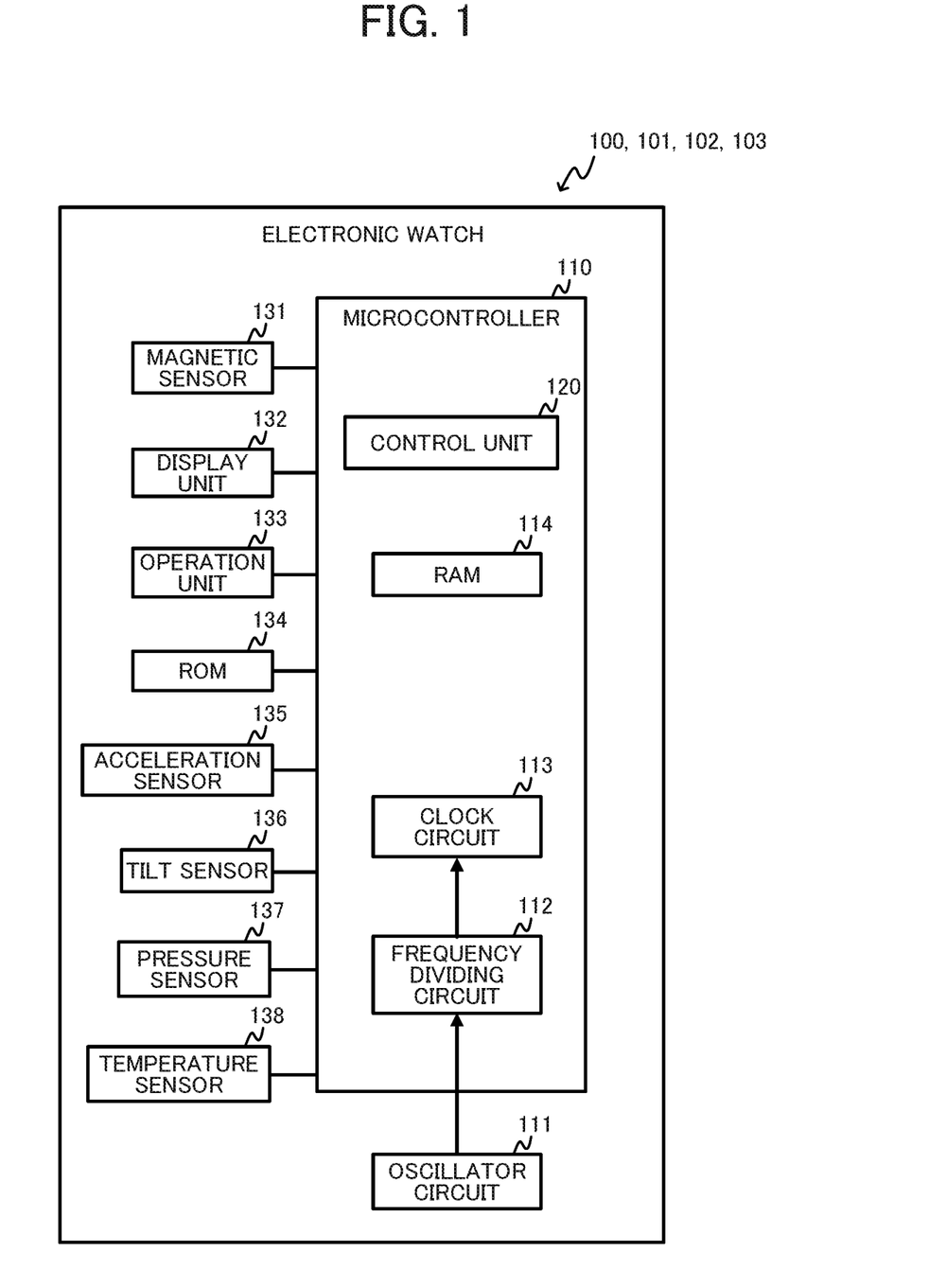
FIG. 1 is a drawing illustrating an example of functional configuration of an electronic watch according to Embodiment 1.

As illustrated in FIG. 1, as a hardware configuration, an electronic watch 100 according to Embodiment 1 includes a micro-controller 110, an oscillator circuit 111, a magnetic sensor 131, a display unit 132, an operation unit 133, a read only memory (ROM) 134, an acceleration sensor 135, a tilt sensor 136, a pressure sensor 137, and a temperature sensor 138.

The micro-controller 110 is provided with a frequency dividing circuit 112, a clock circuit 113, a random-access memory (RAM) 114, and a control unit 120. Further, the frequency dividing circuit 112, the clock circuit 113, and the RAM 114 are not necessarily arranged within the micro-controller 110 and may be arranged to the exterior of the micro-controller 110. The oscillator circuit 111 and the ROM 134 are not necessarily provided to the exterior of the micro-controller 110 and may be provided within the micro-controller 110.

The oscillator circuit 111 causes oscillation of an oscillator such as a quartz oscillator to generate and output a prescribed frequency signal, that is, a clock signal.

The frequency dividing circuit 112 performs frequency division of the frequency signal input from the oscillator circuit 111 and outputs the divided frequency signal as a signal of the frequency used by the clock circuit 113 and/or the control unit 120. The frequency of the signal output by the frequency dividing circuit 112 may be varied on the basis of a setting by the control unit 120.

The clock circuit 113 is a clock that measures the present time by counting oscillations of the signal input from the frequency dividing circuit 112. Further, the clock circuit 113 may include software that changes a value stored in the RAM 114 at every passage of time of a prescribed period, such as each one second, or alternatively, may include dedicated hardware. The time measured by the clock circuit 113 may be an accumulated period after a certain timing, Coordinated Universal Time (UTC), a standard time of a region such as Japan Standard Time (JST), time of a predetermined city (regional time), or the like. The time measured by the clock circuit 113 is not necessarily in year-month-day-hour-minute-second format. In the present embodiment, the oscillator circuit 111, the frequency dividing circuit 112, and the clock circuit 113 are included in the clock unit measuring the day and hour.

The RAM 114 is volatile memory such as static random-access memory (SRAM), dynamic random-access memory (DRAM), or the like, and a storage unit includes the RAM 114 together with the ROM 134. The RAM 114 as working memory stores data such as temporary data, various types of setting data, and image data for display by the display unit 132. In the present embodiment, the term "image data" refers to image data indicating information such as the present time, date, day of the week, and a battery remaining charge.

The control unit 120 includes components such as a central processing unit (CPU), performs various types of calculation processing, and performs general control of overall operations of the electronic watch 100. The control unit 120 reads a control program stored in the ROM 134, and while using the RAM 114 as working memory, performs control, such as display control and calculation control corresponding to various types of functions of the electronic watch 100. Moreover, the control unit 120 is provided with a timer function and can measure whether a prescribed period is passed. Further, the control unit 120 has a multi-thread function and can perform parallel execution of multiple threads, that is, flows of different processing procedures.

The magnetic sensor 131 is a sensor that measures magnitude and direction of the magnetic field along three axes. A magneto-resistive element (MR element), for example, is used as an element for sensing the magnetic field. The values measured by the magnetic sensor 131 are output to the micro-controller 110.

The display unit 132 displays data on the time and/or various types of functions. In the present embodiment, the display unit 132 is provided with a liquid crystal panel for digital display of the time, although such configuration is not limiting. For example, the display unit 132 may be provided with a second hand, a minute hand, an hour hand, or the like, and may perform analog display of data on the time and/or various types of functions. Moreover, the display unit 132 may be provided with a liquid crystal panel in addition to the second hand, the minute hand, the hour hand, or the like, may perform analog display of the time by use of each of the hands, and may further display on the liquid crystal panel the data on the date-time and/or the various types of functions.

The operation unit 133 receives an input operation from a user and thus sends to the micro-controller 110 as an input signal an electrical signal corresponding to the input operation. The operation unit 133, for example, includes a push-button switch, a winding crown, a bezel, or the like. Alternatively, a touch sensor may be stacked on a display screen of the display unit 132 of the operation unit 133, and the touch sensor and the display screen may constitute a touch panel. In this case, the touch sensor senses a contact position and/or a way of touching the display, and sends to the micro-controller 110 an operation signal corresponding to the sensed contact position and/or contact mode.

The ROM 134 is non-volatile memory such as mask ROM, flash memory, or the like, and together with the RAM 114, is included in the storage unit. The ROM 134 stores information such as control programs and initial setting data. The control programs stored in the ROM 134 include a program for below-described automatic calibration processing.

The acceleration sensor 135 is a sensor that measures acceleration along three axial directions. The acceleration sensor 135 measures acceleration by using, for example, deformation of a piezoelectric element by acceleration. The acceleration sensor 135 outputs the measured value to the micro-controller 110. By measuring the acceleration, the acceleration sensor 135 can function as a movement sensor unit due to the ability to sense movement of the electronic watch 100 and the user wearing the electronic watch 100.

The tilt sensor 136 is a sensor that measures tilt of the electronic watch 100. The tilt sensor 136 can measure the tilt by sensing, for example, gravitational acceleration of the earth. The tilt sensor 136 outputs the measured value to the micro-controller 110. The tilt sensor 136 also functions as the movement sensor unit for sensing movement of the user wearing the electronic watch 100. Moreover, the tilt sensor 136 functions also as a tilt measurement unit for sensing the tilt of the electronic watch 100.

The pressure sensor 137 is a sensor that measures pressure of the atmosphere. The pressure sensor 137 measures the air pressure by sensing air pressure by a piezoelectric element, for example. The pressure sensor 137 outputs the measured value to the micro-controller 110.

The temperature sensor 138 is a sensor for measuring heat. In the present embodiment, the temperature sensor 138 measures an air temperature at the periphery of the electronic watch 100. The temperature sensor 138 measures the air temperature by sensing heat by a thermistor, for example. The temperature sensor 138 outputs the measured value to the micro-controller 110.

Functional configuration of the electronic watch 100 according to Embodiment 1 is described above. Function modes of the electronic watch 100 are described next.

The electronic watch 100, in addition to a time mode for performing the normal display of time, has various types of function modes such as an air pressure measurement mode for measurement of the air pressure, a temperature measurement mode for measuring the air temperature, an azimuth measurement mode for measuring azimuth, an altitude measurement mode for measuring altitude, a sunrise-sunset mode for display of the time of sunrise and/or sunset, a stopwatch mode for timing, a timer mode for sounding an alarm after measurement of passage of a set period, an alarm-setting mode for setting the alarm, and a world-time mode for display of UTC or the time in various cities of the world.

The electronic watch 100 runs in various function modes, that is, shifts to a function mode, based on operation of the operation unit 133 by the user. In the case of operation in a function mode other than the time mode, the stopwatch mode, the timer mode, or the world-time mode, upon passage of a determined period thereafter (such as 1 minute or 1 hour, differing in accordance with the function mode) without further user operation, the electronic watch 100 may automatically return to the time mode. These function modes are executed (selected) based on user operation of the operation unit 133 or the like by the control unit 120, and thus the control unit 120 can perform discrimination as to which function mode is presently being run. Therefore, the control unit 120 functions as a discrimination means for performing discrimination as to which function mode is presently being run.

The time mode is a function mode for display of the present time on the display unit 132 and is the normal function used when the electronic watch 100 is being used as a regular watch. Upon starting up the electronic watch 100, the electronic watch 100 starts operation in the time mode as the default setting of the function mode.

The air pressure measurement mode is the function mode that uses the pressure sensor 137 to measure the air pressure and display such pressure on the display unit 132. In the air pressure measurement mode, the electronic watch 100 measures and displays the air pressure at intervals such as every one minute. Moreover, upon passage of one hour without any further operation by the user, the function mode returns to the time mode.

The temperature measurement mode is the function mode that measures the air temperature using the temperature sensor 138 and displays such temperature on the display unit 132. In the temperature measurement mode, the electronic watch 100 measures and displays the air temperature at intervals such as every one minute. Moreover, upon passage of one hour without any further operation by the user, the function mode returns to the time mode.

The azimuth measurement mode is the function mode that measures the geomagnetic field by the magnetic sensor 131 and performs compass-like display of north-based azimuth on the display unit 132. In the azimuth measurement mode, the electronic watch 100 measures an azimuth and displays the north-based azimuth at intervals such as every one second. Moreover, upon passage of one minute without further operation by the user, the function mode returns to the time mode.

The altitude measurement mode is the function mode that uses the pressure sensor 137 to measure the air pressure, converts a change in air pressure to a present value of the altitude, and displays the altitude on the display unit 132. In the altitude measurement mode, the electronic watch 100 measures air pressure and displays the altitude at intervals such as every one hour. Moreover, upon passage of one hour without further operation by the user, the function mode returns to the time mode.

The sunrise-sunset mode is the function mode that calculates the times of sunrise and sunset based on a specific date (year, month, and day) and specific location (latitude and longitude), and displays such times on the display unit 132. In the sunrise-sunset mode, after the electronic watch 100 displays the sunrise and sunset times, for example, upon passage of one minute without further operation by the user, the function mode returns to the time mode.

The stopwatch mode is the function mode that measures the time in $\frac{1}{100}^{th}$ of a second units after pressing of a start button until pressing of a stop button via the operation unit 133, and that displays such time on the display unit 132. In the stopwatch mode, even without further operation by the user for a long period, the function mode remains in the stopwatch mode without returning to the time mode.

The timer mode is the function mode in which, upon setting of a measurement period by use of the operation unit 133 and pressing of the start button, time is measured until passage of the set period, remaining time is displayed on the display unit 132, and a sound is sounded to provide notification of expiration of the set period. In the timer mode, even without further operation by the user for a long period, the function mode remains in the timer mode without returning to the time mode.

The alarm-setting mode is the function mode for setting an alarm time. In the alarm-setting mode, upon passage of a lengthy time interval such as 5 minutes without further operation by the user, the function mode returns to the time mode.

The world-time mode is the function mode in which UTC or the time of various world cities is displayed on the display unit 132. The user can use the operation unit 133 to specify a city whose time or UTC is to be displayed. In the world-time mode, even without further operation by the user for a lengthy time interval, the function mode remains the world-time mode without returning to the time mode.

Although various types of modes are included in the function modes as described above, transition to a function mode other than the time mode does not occur without the user intentionally executing (selecting) such a function mode. That is to say, the running (selecting) of the function mode can be understood to be due to the user wanting to use the function mode. Conversely, the time mode can be understood to be a function mode that is run irrespective of the intention of the user, although the user can intentionally run (select) the time mode, and such running may be, for example, due to a default setting, passage of time, or the like. Thus, the time mode is also termed the default mode, and the function modes other than the time function mode are collectively termed the non-default modes.

In the aforementioned azimuth measurement mode, the electronic watch 100 displays, on the display unit 132, the north-based azimuth on the basis of the measurement value of the magnetic sensor 131. However, when a component within the electronic watch 100 is magnetized (magnetic), the magnetic sensor 131 measures a sum of the geomagnetic field and magnetic field of the magnetized component, and thus the north-based azimuth cannot be correctly displayed. In this case, the magnetic field of the magnetized component is an offset magnetic field applied to each of the three axial directions of the magnetic sensor 131. Therefore, the correct geomagnetic field can be measured by measuring this offset magnetic field, and then subtracting this offset magnetic field from the measured values of the magnetic sensor 131.

The offset magnetic field is the magnetic field due to the component fixed within the electronic watch 100, and thus has a fixed magnitude in each of the three axial directions. Therefore, by measuring the geomagnetic field by the magnetic sensor 131 in various attitudes of the electronic watch 100 such that the direction of the geomagnetic field differs relative to the three axial directions as viewed from the electronic watch 100, the control unit 120 can find the offset magnetic field from a value of average deviation from the geomagnetic field. The finding of the offset magnetic field is termed the calibration of the magnetic sensor 131. During performance of the calibration of the magnetic sensor 131, the control unit 120 functions as a calibration means.

By the user performing a certain operation, such as operation of the winding crown in the azimuth measurement mode, the electronic watch 100 enters a mode for a manual calibration of the magnetic sensor 131, that is, enters a manual calibration mode. The user can perform the manual calibration of the magnetic sensor 131 by an action such as rotation of the electronic watch 100 in this mode. However, such manual calibration is rarely performed by some user due to effort of the user to cause running of the manual calibration mode, and effort such as rotation of the electronic watch 100 thereafter. Thus, measurement of azimuth in the azimuth measurement mode is sometimes performed incorrectly by the electronic watch 100 of the user who does not frequency perform the manual calibration.

However, when the user wearing the electronic watch 100 on the arm is moving (movement state), for example, by walking, the magnetic sensor 131 can measure the magnetic field in various directions due to movement such as swinging of the arm of the user. That is to say, when the user is walking, the electronic watch 100 can perform the calibration of the magnetic sensor 131. Moreover, by sensing movement by the acceleration sensor 135, the electronic watch 100 can determine whether the user wearing the electronic watch 100 is presently walking. Therefore, the calibration of the magnetic sensor 131 can be performed automatically by sensing of walking of the user.

This automatic calibration processing is described with reference to FIG. 2. The automatic calibration processing is processing for automatically performing the calibration of the magnetic sensor 131 by the electronic watch 100, and upon startup of the electronic watch 100, the electronic watch 100 starts execution of such processing in parallel with other processing, such as time measurement processing to measure the date and time.

Firstly, the control unit 120 of the electronic watch 100 determines whether at least 24 hours is passed after the previous calibration of the magnetic sensor 131, including both automatic calibrations and manual calibrations (step S101). The 24 hour period here is one example of the passed period, and a shorter period such as three hours may be used if the magnetic sensor 131 is to be set as accurately as possible, or alternatively, a long period such as 72 hours may be used in order to suppress power consumption of the electronic watch 100.

When 24 hours is not passed (NO in step S101), processing returns to step S101. Such operation is used since, when 24 hours is not passed, the calibration is considered to still be omittable. When at least 24 hours is passed (YES in step S101), the control unit 120 determines, based on measurement of acceleration by the acceleration sensor 135, whether walking by the user wearing the electronic watch 100 on the arm is sensed (step S102). The algorithm for sensing walking by the acceleration sensor 135 is known technology. For example, walking can be sensed by detecting whether or not periodic peaks occur in values measured by the acceleration sensor 135. Step S102 is also termed a sensing step. If walking is not sensed (NO in step S102), processing returns to step S101. In the present embodiment, due to the performance of the calibration on the basis of swinging of the arm during walking, the automatic calibration is not performed unless walking is in progress.

If walking is sensed (YES in step S102), the control unit 120 determines whether a period in which walking continues to be sensed is equal to or greater than a walking standard period such as 60 seconds (step S103). If the period of continuation of walking is less than the walking standard period (NO in step S103), processing returns to step S101. Such a configuration is used since, if the period of continuation is less than the walking standard period, continuation of walking in the future is uncertain, and failure of the automatic calibration that is in progress may occur if walking does not continue. Step S103 is also termed the determination step since determination is made in step S103 as to whether the state of movement (walking) sensed in step S102 is the calibratable state in which the calibration of the magnetic sensor 131 can be performed.

If the period of continuation of walking is equal to or greater than the walking standard period (YES in step S103), the control unit 120 determines whether the present function mode of the electronic watch 100 is the time mode (step S104). Step S104 is also termed the discrimination step. If the time mode is not in progress (NO in step S104), processing returns to step S101. Such configuration is used since, if the function mode is not the time mode, the user is considered to be deliberately setting the present function mode, and convenience for the user may be lost by performing the calibration of the magnetic sensor 131 in such a case without permission.

If the present function mode of the electronic watch 100 is the time mode (YES in step S104), the control unit 120 turns the magnetic sensor 131 ON and executes the automatic calibration (step S105), and processing returns to step S101. In step S105, the calibration is performed by using various changes of the direction of the magnetic sensor 131 due to swinging of the arm of the user during walking. Step S105 is also termed a calibration step.

The automatic calibration processing is described above. Even without the user manually performing the calibration in accordance with the aforementioned automatic calibration processing, the electronic watch 100 senses movement of the user, and if the state of such movement is the walking state, the calibration is performed automatically. Therefore, the electronic watch 100 can perform the calibration of the magnetic sensor 131 without imposing a burden on the user. Furthermore, the walking state can be understood to be a state in which the calibration of the magnetic sensor 131 is possible, and thus may also be termed the calibratable state.

Moreover, the calibration in accordance with such automatic calibration processing is performed only when the present function mode of the electronic watch 100 is the time mode (default mode), thereby enabling avoidance of termination of the function A by the automatic calibration without user permission when the user is using another function such as a function A.

Moreover, rather than performing the calibration only after sensing walking, the electronic watch 100 performs the calibration after recognizing that walking continues for a certain period (walking standard period), and thus such configuration can prevent performance of the calibration when, for example, walking is performed for a few steps in a house, that is, when walking is soon to stop. When the walking soon stops, the swinging of the arm stops prior to completion of the calibration, the calibration cannot be completed, the calibration is performed with low accuracy, or the like; however, the electronic watch 100 can decrease the possibility of lowering of the accuracy or the possibility of failure of the calibration, by performance of the calibration after determination that the period of continuation of walking is equal to or greater than the walking standard period. Due to such configuration, the calibration seldom ends in failure, and power consumption can be suppressed. Further, although in the above embodiment the calibration is to be performed after confirming that the user is continuing to walk, such configuration is not limiting. For example, the calibration may be performed after confirming that the user is continuing to drive a car.

Japanese Patent Application Kokai Publication No. 2005-345389 describes technology that enables the automatic magnetic sensor calibration. However, when using the technology described in Japanese Patent Application Kokai Publication No. 2005-345389, sometimes the calibration fails without obtaining data to be acquired in cases such as when rotational movement of the portable terminal device does not continue. In such cases, a problem arises from the standpoint of power consumption in that the calibration operation is wasted. However, according to the aforementioned embodiment, failure of the calibration and lowering of accuracy can be decreased, thereby enabling a lessening in the occurrence of failed calibrations and enabling suppression of power consumption.

Modified Example 1

In Embodiment 1, automatic calibration processing is executed only when the function mode of the electronic watch 100 is the time mode, that is, the default mode. Such configuration is used since, when the function mode is a non-default mode such as a function A mode that is not the time mode, the function A mode is considered to be deliberately executed by the user since running of the function A mode is desired by the user, and when the calibration is performed in such a case, the function A mode is terminated contrary to the intention of the user.

However, when the user causes running of a non-default mode (function mode, such as the function A mode that is other than the time mode) during the calibration, the user is thought to often stop (stop walking) to check the display operating in the function A mode and to look at the display unit 132. When such action occurs, swinging of the arm stops, and the calibration that is being performed at that time is anticipated to fail. The continuation of the calibration that is anticipated to fail is undesirable from the standpoint of power consumption. Therefore, Modified Example 1 is described below in which the calibration is halted in the case in which the user executes the non-default mode, that is, the function mode other than the time mode, during the calibration.

Functional configuration of the electronic watch 100 according to Modified Example 1 is the same as that of the electronic watch 100 according to Embodiment 1 and is illustrated in FIG. 1. The electronic watch 100 according to Modified Example 1 differs from the electronic watch 100 according to Embodiment 1 in that, in addition to the automatic calibration processing (FIG. 2), in the Modified Example 1 processing for halting the calibration (calibration stoppage processing) is executed when the function mode is observed to change during execution of the calibration and thus the user executes the non-default mode, that is, the function mode other than the time mode. This calibration stoppage processing is described with reference to FIG. 3. Such processing starts in parallel with execution of other processing such as the time measurement processing upon start-up of the electronic watch 100 according to the Modified Example 1.

Figure 3:
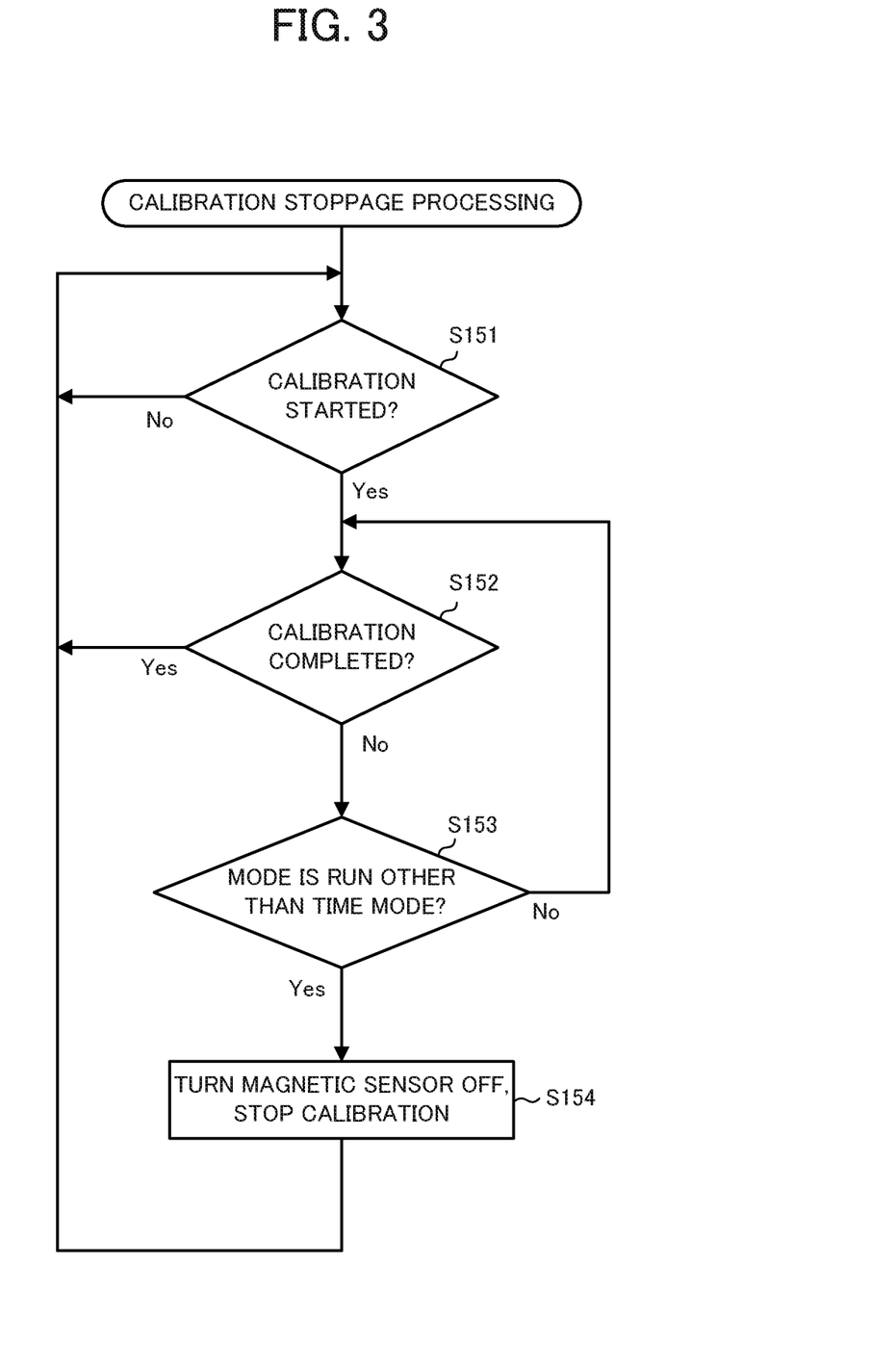
FIG. 3 is a flowchart of calibration stoppage processing according to Modified Example 1.

Firstly, the control unit 120 of the electronic watch 101 determines whether the calibration of the magnetic sensor 131 is starting (step S151). For example, if the calibration is starting regardless of whether the calibration is the manual calibration or the automatic calibration, a flag variable indicating that the calibration is in progress is set to "1", and when the calibration ends, the flag variable is set to "0", and thus the control unit 120 can, by checking the flag variable, determine whether the calibration is started. If the calibration is not starting (NO in step S151), processing returns to step S151.

If the calibration is starting (YES in step S151), the control unit 120 determines whether the calibration of the magnetic sensor 131 is finished (step S152). Such determination can be performed by processing similar to that of step S151. If the calibration is completed (YES in step S152), processing returns to step S151.

If the calibration is not completed (NO in step S152), the control unit 120 determines whether a non-default mode, that is, a function mode other than the time mode, is executed (step S153). Such determination can be performed by sensing whether the user is operating the operation unit 133 so that the non-default mode, that is, the function mode other than the time mode, is executed. If the non-default mode (function mode other than the time mode) is not being executed (NO in step S153), processing returns to step S152.

If the non-default mode (function mode other than the time mode) is executed (YES in step S153), the control unit 120 turns the magnetic sensor 131 OFF to stop the calibration (step S154). Then processing returns to step S151.

Due to the aforementioned calibration stoppage processing (FIG. 3), when the user executes the non-default mode (function mode other than the time mode), the electronic watch 100 stops the calibration of the magnetic sensor 131, and thus the continuation of the calibration having a high probability of failure is prevented, and power consumption can be decreased.

Although upon start-up of the electronic watch 100 according to Modified Example 1, other processing, such as time measurement processing, is described as starting execution in parallel in the aforementioned calibration stoppage processing (FIG. 3), execution start timing is not limited to this configuration. The calibration stoppage processing may be executed when the calibration is executed, regardless of whether the calibration is executed manually or automatically. In this case, the processing of step S151 can be omitted, or the portion "returns to step S151" mentioned in the aforementioned FIG. 3 description can be replaced by "ending calibration stoppage processing".

Modified Example 2

Although in Embodiment 1 the electronic watch 100, after 24 hours is passed since the prior calibration, continues the determination of whether the user is walking, the acceleration sensor 135 is used for such determination, and thus a problem occurs in that power required for operation of the acceleration sensor 135 continues to be consumed. Some sort of movement of the user such as walking can be sensed not only by the acceleration sensor 135 but also by the tilt sensor 136. Power consumption by the tilt sensor 136 is generally lower than that by the acceleration sensor 135. Therefore, Modified Example 2 is described that uses the acceleration sensor 135 after sensing of a prescribed tilt by the tilt sensor 136.

Functional configuration of the electronic watch 100 according to Modified Example 2 is the same as that of the electronic watch 100 according to Embodiment 1 and illustrated in FIG. 1. The electronic watch 100 according to Modified Example 2 differs from the electronic watch 100 according to Embodiment 1 in that, in Modified Example 2 prior to sensing of walking by the acceleration sensor 135 during the automatic calibration processing, firstly the user is detected to be moving by the tilt sensor. The automatic calibration processing according to this Modified Example 2 is described with reference to FIG. 4. Upon start-up of the electronic watch 100 according to Modified Example 2, execution of the automatic calibration processing of Modified Example 2 is started in parallel with the other processing, such as the time measurement processing.

Figure 2:
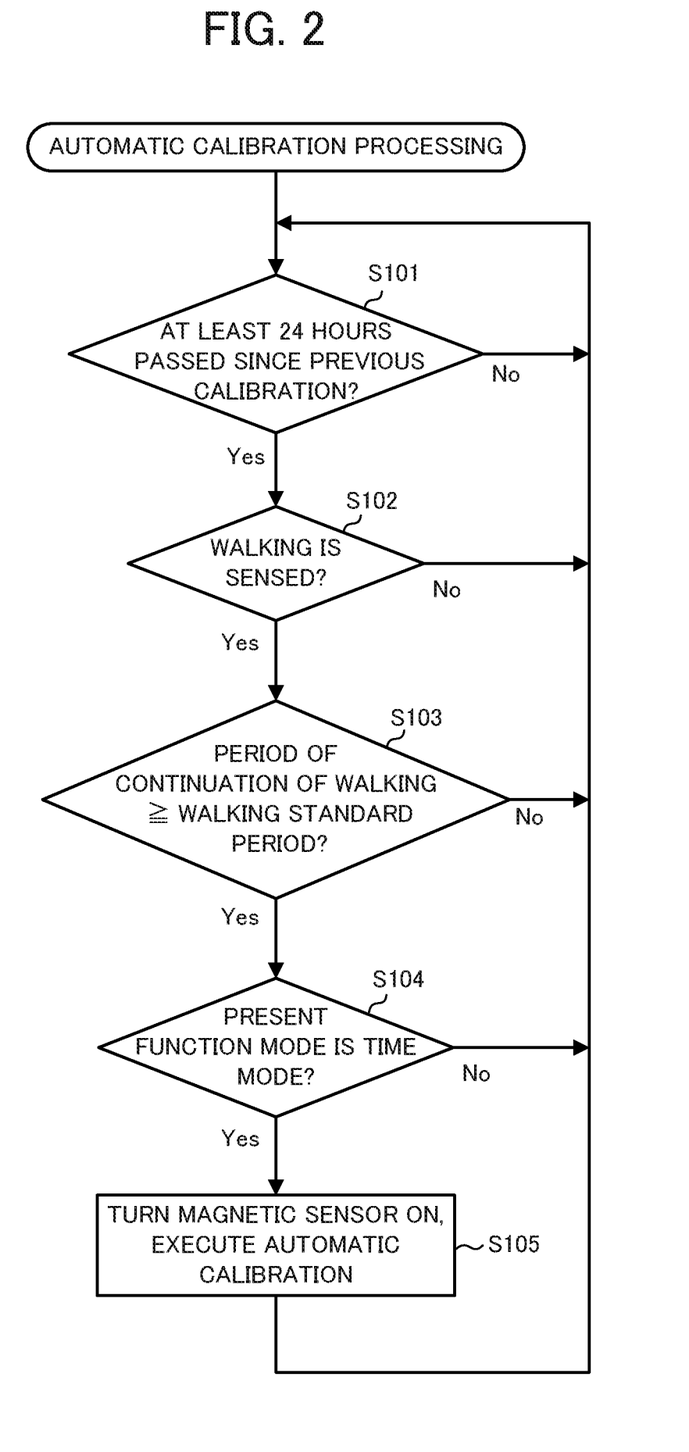
FIG. 2 is a flowchart of automatic calibration processing according to Embodiment 1.

The automatic calibration processing according to Modified Example 2 (FIG. 4) is processing that appends step S111 between step S101 and step S102 of the automatic calibration processing according to Embodiment 1 (FIG. 2). Therefore, step S111 is described below. In step S111, the control unit 120 determines whether the tilt measured by the tilt sensor 136 is changed from a previously measured tilt. If there is no change (NO in step S111), processing returns to step S101. If there is a change (YES in step S111), the control unit 120 uses the acceleration sensor 135 to determine whether walking of the user wearing the electronic watch 100 on the arm is detected (step S102).

Figure 4:
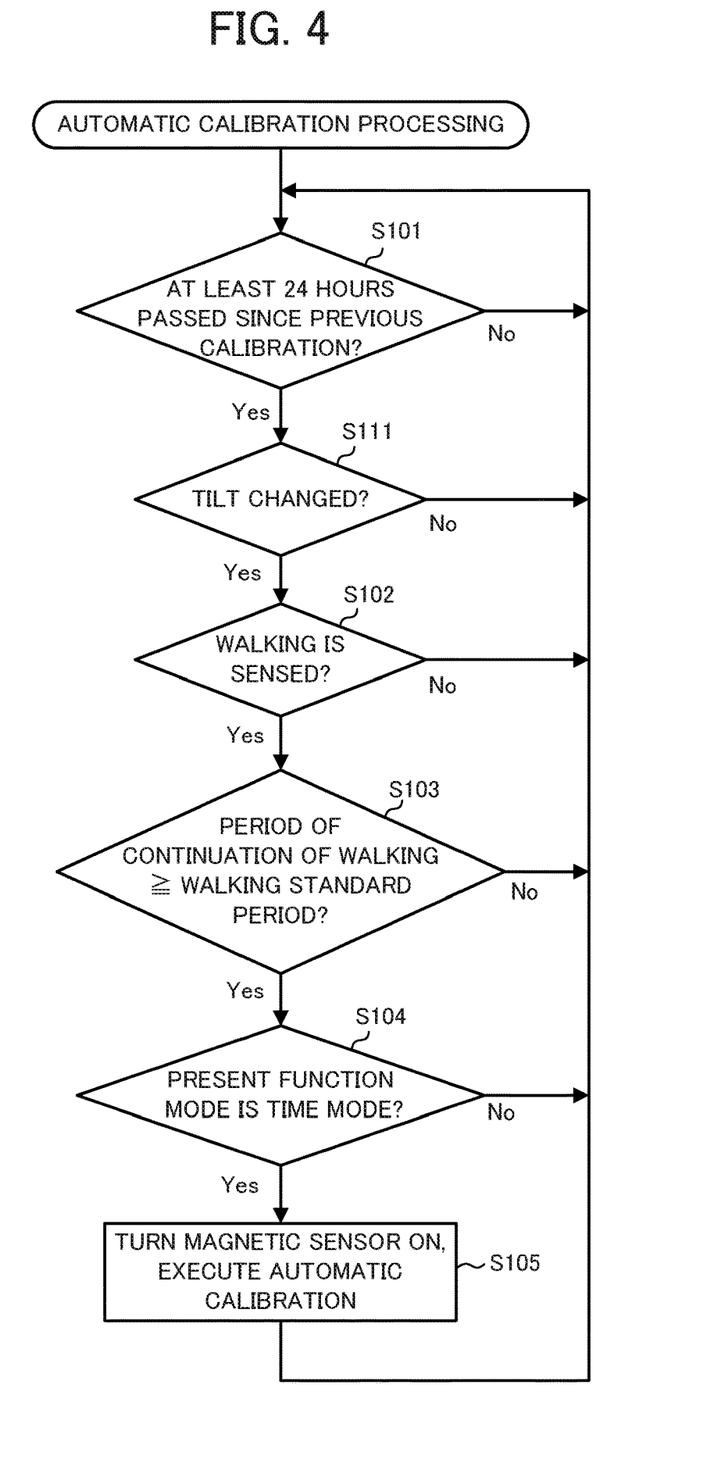
FIG. 4 is a flowchart of automatic calibration processing according to Modified Example 2.

Except for the aforementioned processing, the automatic calibration processing according to Modified Example 2 is the same as the automatic calibration processing (FIG. 2) according to Embodiment 1, and thus description thereof is omitted. The electronic watch 100 according to Modified Example 2, due to confirmation of whether the user is moving by the tilt sensor 136 prior to sensing of walking by the acceleration sensor 135, can lessen power consumption.

Embodiment 2

Although in Embodiment 1 the electronic watch 100 senses walking of the user and then performs the calibration, the timing of the performance of the calibration is not limited to performance upon sensing the walking of the user. Although an act of looking at the electronic watch by the user wearing the electronic watch on the arm is thought to be performed relatively frequently, after such an act, the user normally performs an action of swinging the arm downward. The calibration can be also performed during the act of swinging the arm downward since, like the action of swinging the arm during walking, the act of swinging the arm downward is an act of moving the electronic watch worn on the arm while changing an orientation of the electronic watch. Thus, Embodiment 2 is described below in which execution of the automatic calibration is triggered by the act of looking at the display of the electronic watch.

Functional configuration of the electronic watch 101 according to Embodiment 2 is the same as that of the electronic watch 100 according to Embodiment 1 and is illustrated in FIG. 1. Moreover, the function modes of the electronic watch 101 according to Embodiment 2 are also the same as the function modes of the electronic watch 100 according to Embodiment 1, and there is no particular difference between the manual calibration functions of the electronic watch 101 according to Embodiment 2 and the manual calibration functions of the electronic watch 100 according to Embodiment 1. However, the automatic calibration processing of the electronic watch 101 according to Embodiment 2 is different from the automatic calibration processing of the electronic watch 100 according to Embodiment 1 (FIG. 2), and thus the automatic calibration processing of the electronic watch 101 is described below with reference to FIG. 5. Upon start-up of the electronic watch 101, execution of this automatic calibration processing starts in parallel with other processing, such as time measurement processing.

Figure 5:
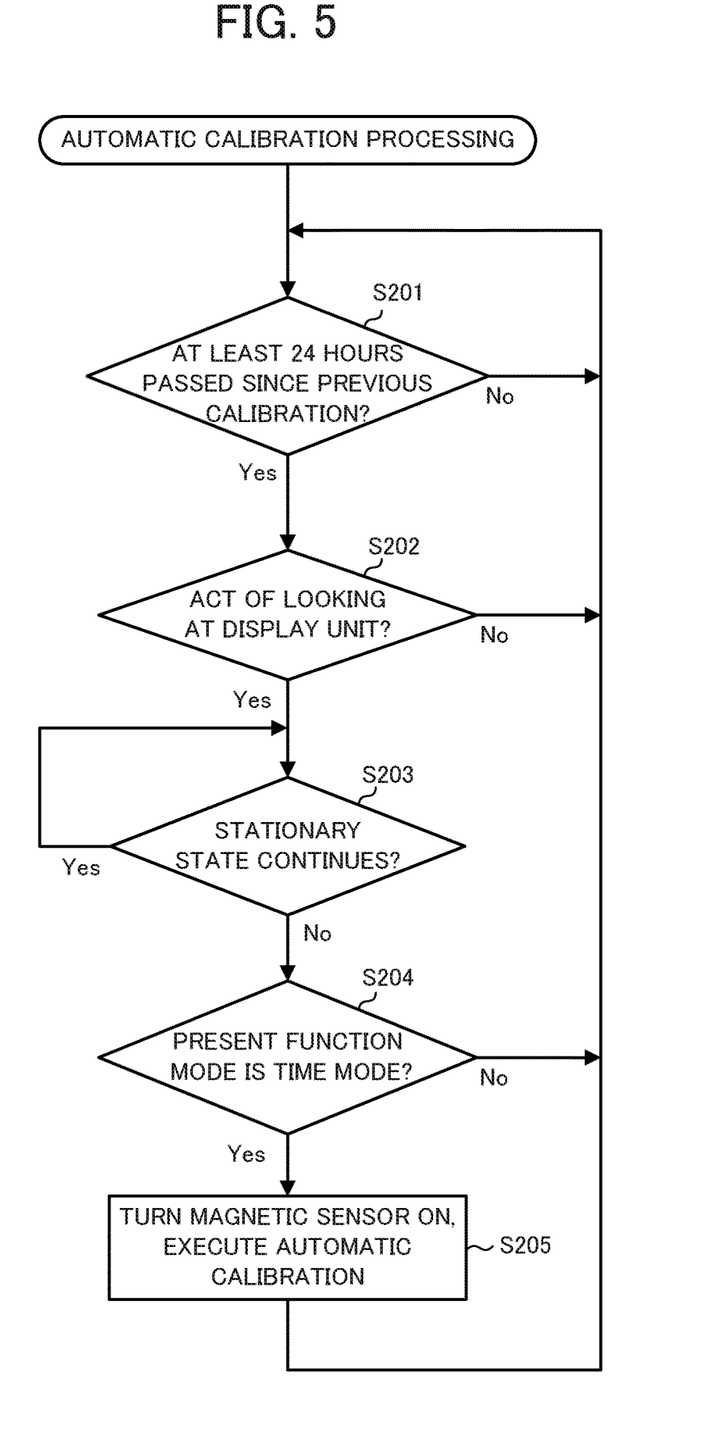
FIG. 5 is a flowchart of automatic calibration processing according to Embodiment 2.

Firstly, the control unit 120 of the electronic watch 101 determines whether at least 24 hours is passed after the previous calibration of the magnetic sensor 131, regardless of whether the previous calibration is the manual calibration or the automatic calibration, (step S201). In the same manner as in Embodiment 1, the setting of the passed period to 24 hours is an example; a shorter period, such as 3 hours, may be used if the magnetic sensor 131 is to be as accurate as possible; and a longer period, such as 72 hours, may be used if suppression of power consumption of the electronic watch 101 is desired.

If 24 hours is not passed (NO in step S201), processing returns to step S201. Such configuration is used since not performing the calibration is considered to still be permissible if 24 hours is not passed. If at least 24 hours is passed (YES in step S201), the control unit 120 determines whether the user wearing the electronic watch 101 on the arm performs the act of looking at the electronic watch 101 (display unit 132) by using the change of acceleration according to the acceleration sensor 135, the tilt of the electronic watch 101 according to the tilt sensor 136, or both the change in acceleration according to the acceleration sensor 135 and the tilt of the electronic watch 101 according to the tilt sensor 136 (step S202). Whether the user performs the act of looking at the electronic watch 101 (display unit 132) can be determined on the basis of (i) a change in acceleration of the part where the user wears the electronic watch 101 when the user is performing the act of looking at the display unit 132 of the electronic watch 101 from the state in which the arm is naturally swung downward, (ii) tilt of the electronic watch 101 when the user looks at the display unit 132, or the like. If the act of looking at the electronic watch 101 (display unit 132) is not being performed (NO in step S202), processing returns to step S201.

Since the calibration is performed based on swinging of the arm after the act of looking at the electronic watch 101 (display unit 132) in the present embodiment, the automatic calibration is not performed unless the act of looking at the electronic watch 101 (display unit 132) is performed.

If the act of looking at the electronic watch 101 (display unit 132) is performed (YES in step S202), the control unit 120 uses the acceleration sensor 135 to determine whether the stationary state of the electronic watch 101 is continuing (step S203). If the stationary state of the electronic watch 101 is continuing (YES in step S203), processing returns to step S203. Such configuration is used since the interval while the stationary state continues is thought to be when the user is continuing to look at the electronic watch 101 (display unit 132), and the swinging movement of the arm is not starting.

If the stationary state of the electronic watch 101 is not continuing (NO in step S203), the control unit 120 determines whether the present function mode of the electronic watch 101 is the time mode (step S204). If the present function mode is not the time mode (NO in step S204), processing returns to step S201. Such configuration is used since, if the present function mode is not the time mode, the user is considered to be deliberately setting the present function mode, and convenience for the user may be lost by performing the calibration of the magnetic sensor 131 in such a case without permission.

If the present function mode of the electronic watch 101 is the time mode (YES in step S204), the control unit 120 turns the magnetic sensor 131 ON and executes the automatic calibration (step S205), and processing returns to step S201. In step S205, the calibration is performed using the change of the orientation of the magnetic sensor 131 to various directions due to the act of downward swinging of the arm previously raised in order for the user to look at the electronic watch 101 (display unit 132). That is, the calibration is performed by the electronic watch 101 after determining whether the user performs the act of looking at the electronic watch 101. Such configuration enables reliable use of timing of the change of the orientation of the magnetic sensor 131 to various directions due to swinging downward of the arm that is previously raised for the user to then look at the electronic watch 101, thereby decreasing the possibility of the failure of the calibration or the possibility of the low accuracy of the calibration. Such configuration decreases the frequency of calibrations that end in failure and enables suppression of power consumption.

The automatic calibration processing according to Embodiment 2 is described above. Due to the aforementioned automatic calibration processing, even without the user performing the manual calibration, the electronic watch 101 senses the movement of the user, and if the state of such movement is the operational state in which the electronic watch 101 is looked at, performs the calibration automatically. Therefore, the electronic watch 101 can perform the calibration of the magnetic sensor 131 without imposing a burden on the user. Further, the operational state in which the electronic watch 101 is looked at can be understood to be a state in which the calibration of the magnetic sensor 131 is possible, and thus this state may also be termed the calibratable state.

Moreover, this calibration is performed only when the present function mode of the electronic watch 101 is the time mode, and thus by the performance of the calibration automatically when the user is using another function such as the function A, termination of the function A without permission can be avoided.

Embodiment 3

Another timing may be considered for the performance of the calibration. For example, the timing may be a timing at which, after the electronic watch is in a state of static placement on a desk, the user then takes up the electronic watch and attaches the electronic watch to the arm. According to such timing, the electronic watch taken up by the user moves while the orientation of the electronic watch changes until the electronic watch is attached to the arm, and thus the calibration can be performed. Thus Embodiment 3 is described below in which the calibration is performed automatically at the timing of attachment to the arm.

Functional configuration of the electronic watch 102 according to Embodiment 3 is the same as that of the electronic watch 100 according to Embodiment 1, and is illustrated in FIG. 1. Moreover, the function modes of the electronic watch 102 according to Embodiment 3 are the same as the function modes of the electronic watch 100 according to Embodiment 1, and there is no particular difference in the manual calibration function of the electronic watch 102 according to Embodiment 3 versus the electronic watch 100 according to the Embodiment 1. However, the automatic calibration processing of the electronic watch 102 according to Embodiment 3 differs from the automatic calibration processing of the electronic watch 100 according to Embodiment 1 (FIG. 2), and thus the automatic calibration processing of the electronic watch 102 is described below with reference to FIG. 6. Upon start-up of the electronic watch 102, execution of the automatic calibration processing of Embodiment 3 starts in parallel to other processing such as time measurement processing.

Figure 6:
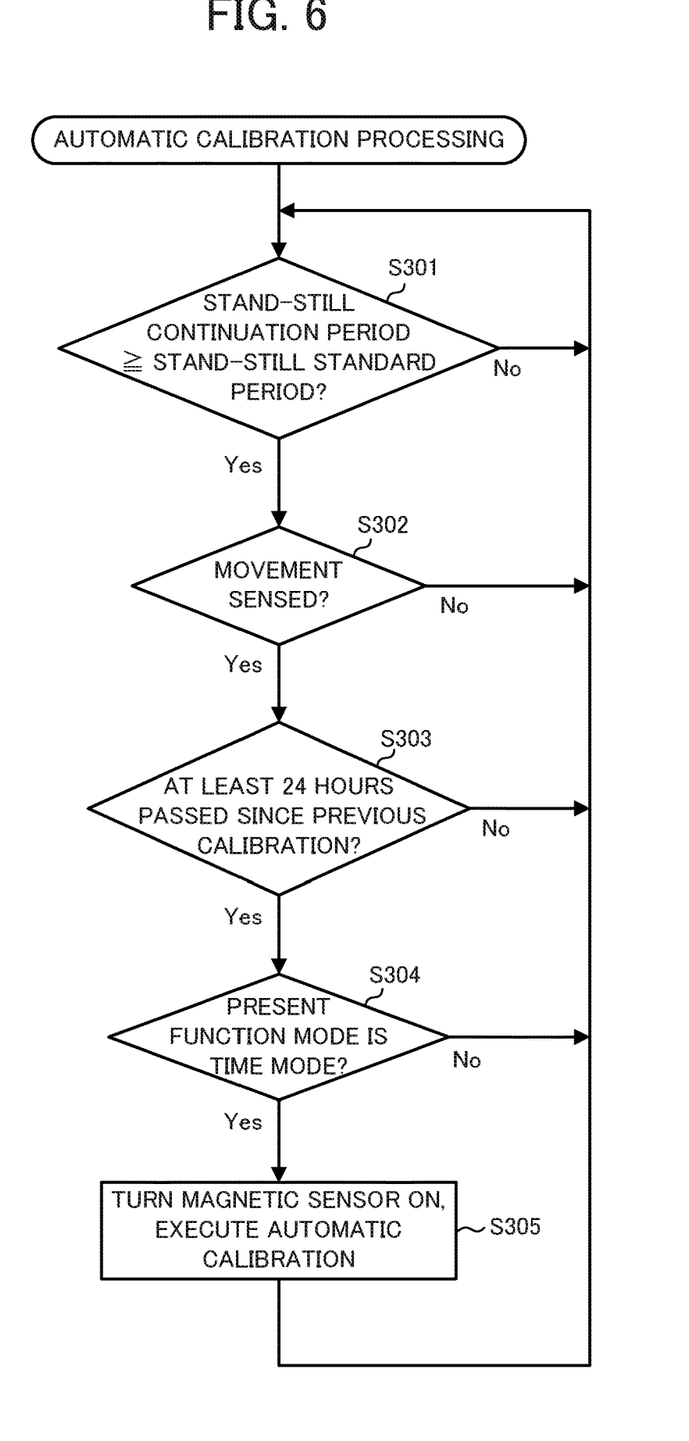
FIG. 6 is a flowchart of automatic calibration processing according to Embodiment 3.

Firstly, the control unit 120 of the electronic watch 102 determines whether a time (stand-still continuation period) during which the electronic watch 102 continues to stand still is equal to or greater than a stand-still standard period, such as 3 hours or more, by using the change in acceleration according to the acceleration sensor 135, the change in tilt according to the tilt sensor 136, or both the change in acceleration according to the acceleration sensor 135 and change in tilt according to the tilt sensor 136 (step S301). If the stand-still continuation period is less than the stand-still standard period (NO in step S301), processing returns to step S301.

If the stand-still continuation period is equal to or greater than the stand-still standard period (YES in step S301), the control unit 120 determines whether the electronic watch 102 is moved, that is, whether a position or orientation of the electronic watch 102 changes, by using the change in acceleration according to the acceleration sensor 135, the change in tilt according to the tilt sensor 136, or both the change in acceleration according to the acceleration sensor 135 and change in tilt according to the tilt sensor 136 (step S302). If the electronic watch 102 does not move, that is, the position or orientation of the electronic watch 102 does not change (NO in step S302), processing returns to step S301.

If the electronic watch 102 is moved, that is, in position or orientation of the electronic watch 102 changes (YES in step S302), the control unit 120 determines whether at least 24 hours is passed after the previous calibration of the magnetic sensor 131, regardless of whether the previous calibration is the manual calibration or the automatic calibration, (step S303). In the same manner as in Embodiment 1, the setting of the passed period to 24 hours is an example; a shorter period, such as 3 hours, may be used if the magnetic sensor 131 is to be as accurate as possible; and a longer period, such as 72 hours, may be used if suppression of power consumption of the electronic watch 102 is desired.

If 24 hours is not passed (NO in step S303), processing returns to step S301. Such configuration is used since, if 24 hours is not passed, omission of the calibration still is considered to be permissible. If at least 24 hours is passed (YES in step S303), the control unit 120 determines whether the present function mode of the electronic watch 102 is the time mode (step S304). If the present function mode is not the time mode (NO in step S304), processing returns to step S301. Such configuration is used since, if the present function mode is not the time mode, the user is considered to be deliberately performing setting to the present function mode, and when the calibration of the magnetic sensor 131 is performed without permission in this case, convenience for the user may be lost.

When the present function mode of the electronic watch 102 is the time mode (YES in step S304), the control unit 120 turns the magnetic sensor 131 ON and executes the automatic calibration (step S305), and processing returns to step S301. In step S305, the calibration is performed using the change of the orientation of the magnetic sensor 131 to various directions due to movement when the electronic watch 102 is attached to the arm by the user. That is to say, the electronic watch 102 performs the calibration after determining that the electronic watch 102 is moved due to the user attaching the electronic watch 102 to the arm. Due to such configuration, after movement such as the user attaching the electronic watch 102 to the arm, the timing of the change of the orientation of the magnetic sensor 131 to various directions can be reliability used, thereby enabling lowering of the possibility of failure of the calibration, the possibility of lowering of accuracy, or the like. Thus, the calibration seldom ends in failure, and power consumption can be suppressed.

The automatic calibration processing according to Embodiment 3 is described above. Due to the aforementioned automatic calibration processing, even when the user does not perform the calibration manually, the electronic watch 102 senses movement of the user and performs the calibration automatically if the state of such movement is the operational state in which the electronic watch 102 is attached to the arm. Therefore, the electronic watch 102 can perform the calibration of the magnetic sensor 131 without imposing a burden on the user. Further, the operational state in which the electronic watch 102 is attached to the arm can be understood to be a state in which the calibration of the magnetic sensor 131 is possible, and thus this state may also be termed the calibratable state.

Moreover, this calibration is only performed when the present function mode of the electronic watch 102 is the time mode, and thus when the user is using another function, such as the function A, the automatic calibration can be performed, thereby avoiding termination of the function A without permission.

Embodiment 4

Another timing may be considered for the performance of the calibration. For example, the timing may be a timing at which the user removes the watchband of the electronic watch. According to such timing, the calibration can be performed since the electronic watch is moved while changing the orientation of the electronic watch until the user places the electronic watch on a desk or the like after releasing the watchband of the electronic watch and removing the electronic watch from the arm. Thus Embodiment 4 is described below in which execution of the automatic calibration is triggered by an act of releasing the watchband of the electronic watch by the user.

Functional configuration of the electronic watch 103 according to Embodiment 4 is the same as that of the electronic watch 100 according to Embodiment 1, and is illustrated in FIG. 1. Moreover, the function modes of the electronic watch 103 according to Embodiment 4 are the same as the function modes of the electronic watch 100 according to Embodiment 1, and there is no particular difference between the manual calibration function of the electronic watch 103 according to Embodiment 4 and the manual calibration of the electronic watch 100 according to the Embodiment 1. However, the automatic calibration processing of the electronic watch 103 according to Embodiment 4 differs from the automatic calibration processing of the electronic watch 100 according to Embodiment 1 (FIG. 2), and thus the automatic calibration processing of the electronic watch 103 is described below with reference to FIG. 7. Upon start-up of the electronic watch 103, execution of the automatic calibration processing of Embodiment 4 starts in parallel with other processing such as time measurement processing.

Figure 7:
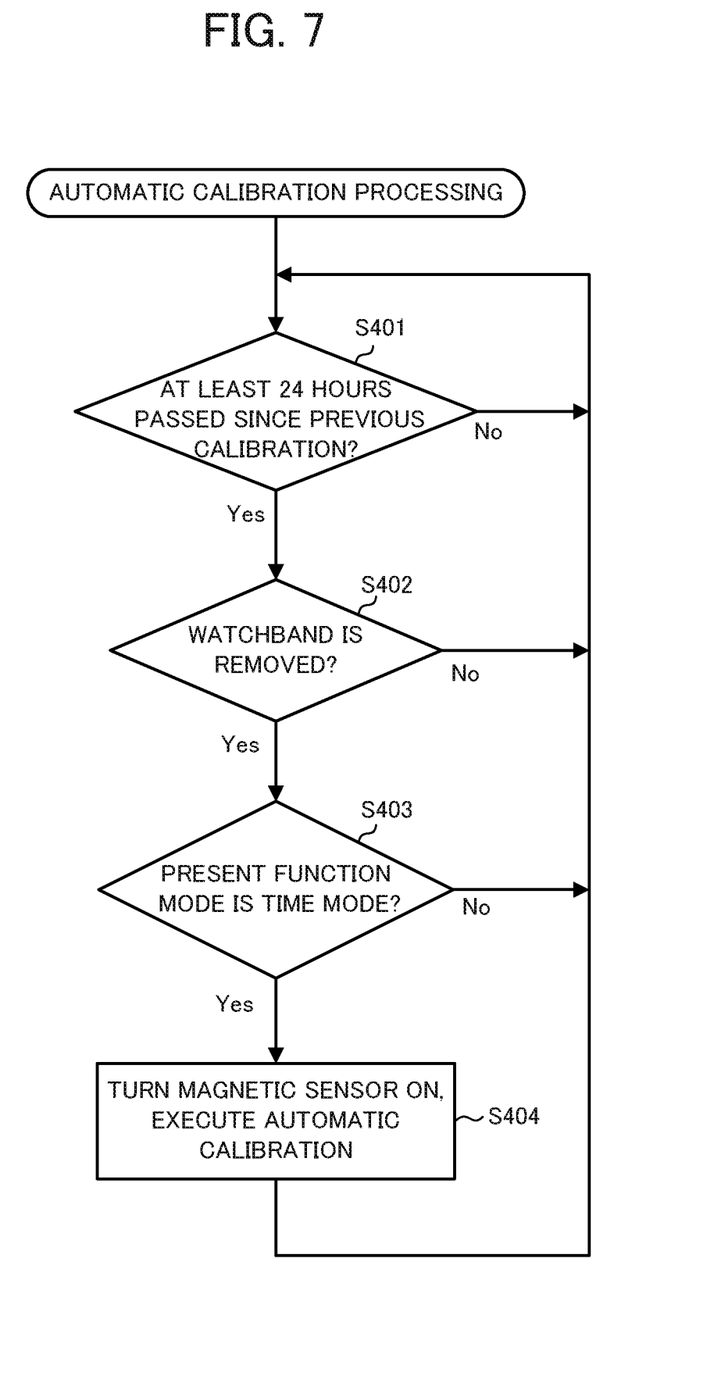
FIG. 7 is a flowchart of automatic calibration processing according to Embodiment 4.

Firstly, the control unit 120 of the electronic watch 103 determines whether at least 24 hours is passed after the previous calibration of the magnetic sensor 131 regardless of whether the previous calibration is the manual calibration or the automatic calibration (step S401). In the same manner as in Embodiment 1, the setting of the passed period to 24 hours is an example; a shorter period, such as 3 hours, may be used if the magnetic sensor 131 is to be as accurate as possible; and a longer period, such as 72 hours, may be used if suppression of power consumption of the electronic watch 103 is desired.

If 24 hours is not passed (NO in step S401), processing returns to step S401. Such configuration is used since not performing the calibration is considered to still be permissible if 24 hours is not passed. If at least 24 hours is passed (YES in step S401), the control unit 120 determines whether the user wearing the electronic watch 103 on the arm performs the act of removing the watchband of the electronic watch 103, by using the change in acceleration according to the acceleration sensor 135, the tilt of the electronic watch 103 according to the tilt sensor 136, or both the change in acceleration according to the acceleration sensor 135 and the tilt of the electronic watch 103 according to the tilt sensor 136 (step S402).

Due to performing an act of rotating the wrist that is characteristic of the release of the watchband when the user releases the watchband of the electronic watch 103, the control unit 120 can determine in step S402, based upon such movement of the wrist or the like, whether the watchband is previously removed by the user. Moreover, the watchband part of the electronic watch 103 may be provided with a watchband attachment sensor that is capable of sensing attachment and removal of the watchband. If the electronic watch 103 is provided with the watchband attachment sensor, the control unit 120 can determine, by a result of sensing by the watchband attachment sensor, whether the watchband is removed.

If the watchband is not removed (NO in step S402), processing returns to step S401. In the present embodiment, the calibration is performed on the basis of movement of the electronic watch 103 after removal of the electronic watch 103, and therefore the automatic calibration is not performed unless the act of removing the electronic watch 103 is performed.

If the watchband is removed (YES in step S402), the control unit 120 determines whether the present function mode of the electronic watch 103 is the time mode (step S403). If the present function mode is not the time mode (NO in step S403), processing returns to step S401. Such configuration is used since, if the present function mode is not the time mode, the user is considered to be deliberately performing setting to the present function mode, and when the calibration of the magnetic sensor 131 is performed without permission in this case, convenience for the user may be lost. However, after removal of the watchband, the user is considered not to use the electronic watch 103 until attachment is repeated, and thus the processing of step S403 may be omitted.

When the processing of step S403 is not omitted, if the present function mode of the electronic watch 103 is the time mode in step S403 (YES in step S403), the control unit 120 turns the magnetic sensor 131 ON and executes the automatic calibration processing (step S404), and processing returns to step S401. In step S404, the calibration is performed using the change of the orientation of the magnetic sensor 131 to various directions due to the act of the user taking the electronic watch 103 from the arm and placing the electronic watch 103 on the desk or the like by the user. That is to say, the electronic watch 103 performs the calibration after determining that the electronic watch 103 is removed from the arm. Due to such configuration, after placement of the electronic watch 103 on the desk or the like by the user, the timing of the change of the orientation of the magnetic sensor 131 to various directions can be reliability used, thereby enabling lowering of the possibility of failure of the calibration, the possibility of lowering of accuracy, or the like. Thus, the calibration seldom ends in failure, and power consumption can be suppressed.

The automatic calibration processing according to Embodiment 4 is described above. Due to the aforementioned automatic calibration processing, even without the user performing the manual calibration, the electronic watch 103 senses movement of the user, and if the state of such movement is the operational state of removing the electronic watch 103 from the arm, the calibration is performed automatically. Therefore, the electronic watch 103 can perform the calibration of the magnetic sensor 131 without imposing a burden on the user. Furthermore, the state in which the electronic watch 103 is removed from the arm can also be understood to be a state in which the calibration of the magnetic sensor 131 is enabled, and thus may also be termed the calibratable state.

Furthermore, the present disclosure is not limited to the aforementioned embodiments, and modifications are possible by variously combining such embodiments. For example, although in the aforementioned embodiments an electronic watch is cited as one example of the wearable device provided with the magnetic sensor, the present disclosure is not limited to the electronic watch, and application is possible to a freely-selected wearable device provided with the magnetic sensor, such as a smartwatch, a physical activity meter, or the like. Although an electronic watch is to be provided with a time-measuring unit for measuring the date and hour, in the case of application to a wearable device that may omit measurement of the date and hour, the time-measuring unit may be omitted from the wearable device.

Moreover, combining the automatic calibration processing occurring in the aforementioned embodiments enables an increase in the number of timings of the performance of the automatic magnetic sensor calibration. For example, if Embodiment 1 and Embodiment 2 are combined, the accuracy of the magnetic sensor 131 can be further increased, by performing the automatic calibration not only when the user is walking but also when the act of looking at the display unit 132 is performed.

Moreover, for example, by combining Embodiments 2-4 and Modified Example 1, the calibration can be stopped in the case in which the user during the calibration changes the function mode to an function mode other than the time mode (non-default mode) in the electronic watches 101, 102, and 103 according to Embodiments 2-4, and wasteful consumption of power can be prevented.

Each of the electronic watches 100, 101, 102, and 103 of the aforementioned embodiments is described as being provided with the pressure sensor 137. However, if the electronic watches 100, 101, 102, and 103 are not necessarily provided with the function mode requiring the pressure sensor 137, such as the air pressure measurement mode and the altitude measurement mode, then the pressure sensor 137 may be omitted from each of the electronic watches 100, 101, 102, and 103.

Moreover, Each of the electronic watches 100, 101, 102, and 103 of the aforementioned embodiments are described as being provided with the temperature sensor 138. However, if the electronic watches 100, 101, 102, and 103 are not necessarily provided with the function mode requiring the temperature sensor 138, such as the temperature measurement mode, then the temperature sensor 138 may be omitted from each of the electronic watches 100, 101, 102, and 103.

Moreover, for example, sensing walking by sensing the existence of periodic peaks in values measured by the acceleration sensor is described as a method of sensing of walking by the acceleration sensor 135. However, this method is not limiting, and walking may be sensed by a freely-selected method as long as the method of sensing walking is based on output of the acceleration sensor 135.

Furthermore, the functions of each of the electronic watches 100, 101, 102, and 103 can be achieved using a computer such as a portable personal computer (PC). Specifically, a program for automatic calibration processing performed by the electronic watches 100, 101, 102, and 103 in the aforementioned embodiments is described as being stored beforehand on the ROM 134. However, the devices according to the present disclosure may include a computer capable of achieving each of the aforementioned functions by (i) storing the program on a computer-readable storage medium such as a flexible disc, a compact disc read only memory (CD-ROM), a digital versatile disc (DVD), a magneto-optical (MO) disc, a memory card, a universal serial bus (USB) memory, or the like, (ii) distributing the computer-readable storage medium, and (iii) reading and installing the program on the computer.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A wearable device comprising:
a magnetic sensor; and
a processor configured to:
   perform a magnetic sensor calibration of the magnetic sensor;
   selectively execute one of a plurality of function modes comprising a first function mode and a second function mode;
   determine whether a calibratable state exists, the calibratable state being a state in which a movement state of the wearable device sensed meets a predetermined condition indicating that the magnetic sensor is calibratable;
   determine which function mode of the plurality of function modes is being executed;
   perform the magnetic sensor calibration in response to the function mode being executed being the first function mode and determining that the calibratable state exists; and
   not perform the magnetic sensor calibration in response to the function mode being executed being the second function mode or determining the calibratable state does not exist.

2. The wearable device according to claim 1, further comprising a movement sensor configured to sense information indicating movement of a user,
   wherein the processor is configured to determine whether the calibratable state exists based on the information sensed by the movement sensor.

3. The wearable device according to claim 1,
   wherein the processor is configured to:
      determine whether a period of continuation of the movement state is equal to or greater than a prescribed movement standard period;
      in response to determining that the period of continuation of the movement state is equal to or greater than the prescribed movement standard period, determine that the calibratable state exists; and
      in response to determining that the period of continuation of the movement state is not equal to or greater than the prescribed movement standard period, determine that the calibratable state does not exist.

4. The wearable device according to claim 1,
   wherein the predetermined condition indicating that the magnetic sensor is calibratable comprises at least one of (i) an act of swinging downward an arm wearing the wearable device, (ii) an act of attaching the wearable device on the arm, and (iii) an act of removing the wearable device from the arm.

5. The wearable device according to claim 1,
   wherein the processor is configured to:
      determine that the function mode being executed has switched from the first function mode to the second function mode; and
      in response to determining that the function mode being executed has switched from the first function mode to the second function mode, stop performing the magnetic sensor calibration.

6. The wearable device according to claim 2, further comprising a tilt measurement unit configured to measure a tilt of the wearable device,
   wherein the movement sensor is configured to:
      not sense the information indicating the movement of the user during a period when the tilt measured by the tilt measurement is not changing; and
      sense the information indicating the movement of the user during a period when the tilt measured by the tilt measurement is changing.

7. The wearable device according to claim 1,
wherein the first function mode is realizable by transition from the second function mode without user operation, and
wherein the first function mode is not shifted to the second function mode unless a user operates the wearable device.

8. The wearable device according to claim 1,
wherein the first function mode is a function mode that is automatically set during startup of the wearable device, and
wherein the second function mode is a function mode that is not automatically set during the startup of the wearable device.

9. The wearable device according to claim 1,
wherein the first function mode is a function mode configured to display time, and
wherein the second function mode is any one of a stopwatch mode, a timer mode, a sunrise-sunset mode, an air pressure measurement mode, a temperature measurement mode, an azimuth measurement mode, an altitude measurement mode, and an alarm-setting mode.

10. An electronic watch comprising the wearable device according to claim 1.

11. A magnetic sensor calibration method for performing a magnetic sensor calibration of a magnetic sensor of a wearable device, the magnetic sensor calibration method comprising:
selectively executing one of a plurality of function modes comprising a first function mode and a second function mode;
determining whether a calibratable state exists, the calibratable state being a state in which a movement state of the wearable device sensed meets a predetermined condition indicating that the magnetic sensor is calibratable;
determining which function mode of the plurality of function modes is being executed;
performing the magnetic sensor calibration in response to the function mode being executed being the first function mode and determining that the calibratable state exists; and
not performing the magnetic sensor calibration in response to the function mode that is being executed being the second function mode or determining the calibratable state does not exist.

12. A non-transitory computer-readable recording medium recording a program for performing a magnetic sensor calibration, wherein the program causes a computer of a wearable device to at least perform:
selectively executing one of a plurality of function modes comprising a first function mode and a second function mode;
determining whether a calibratable state exists, the calibratable state being a state in which a movement state of the wearable device sensed meets a predetermined condition indicating that the magnetic sensor is calibratable;
determining which function mode of the plurality of function modes is being executed;
performing the magnetic sensor calibration in response to the function mode being executed being the first function mode and determining that the calibratable state exists; and
not performing the magnetic sensor calibration in response to the function mode that is being executed being the second function mode or determining the calibratable state does not exist.

\* \* \* \* \*